United States Patent
Miyashita

(10) Patent No.: US 8,177,947 B2
(45) Date of Patent: May 15, 2012

(54) SPUTTERING TARGET

(75) Inventor: Hirohito Miyashita, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1236 days.

(21) Appl. No.: 11/912,450

(22) PCT Filed: Mar. 28, 2006

(86) PCT No.: PCT/JP2006/306223
§ 371 (c)(1),
(2), (4) Date: Oct. 24, 2007

(87) PCT Pub. No.: WO2006/117949
PCT Pub. Date: Nov. 9, 2006

(65) Prior Publication Data
US 2009/0032392 A1    Feb. 5, 2009

(30) Foreign Application Priority Data
Apr. 28, 2005   (JP) ................. 2005-132224

(51) Int. Cl.
*C23C 14/34*   (2006.01)
(52) U.S. Cl. ........... 204/298.13; 420/417; 420/422; 420/427; 420/429; 420/430; 420/580; 148/422; 75/245
(58) Field of Classification Search ......... 204/298.13; 75/245; 148/422; 420/417, 422, 427, 429, 420/430, 580
See application file for complete search history.

(56) References Cited

U.S. PATENT DOCUMENTS

| | | |
|---|---|---|
| 4,994,118 A | 2/1991 | Pircher et al. |
| 6,193,821 B1 | 2/2001 | Zhang |
| 6,197,134 B1 | 3/2001 | Kanzaki et al. |
| 6,323,055 B1 | 11/2001 | Rosenberg et al. |
| 6,331,233 B1 | 12/2001 | Turner |

(Continued)

FOREIGN PATENT DOCUMENTS

EP    0902102 A1    3/1999

OTHER PUBLICATIONS

English Abstract of JP 2001-271161 A, Oct. 2, 2001.

(Continued)

*Primary Examiner* — Rodney McDonald
(74) *Attorney, Agent, or Firm* — Howson & Howson LLP

(57) ABSTRACT

Provided is a sputtering target in which the ratio of X-ray intensity of (110) measured with X-ray diffraction is 0.4 or less, and even 0.2 or less in a Ta or Ta alloy target. Further provided is a sputtering target in which the ratio of X-ray intensity of (110) on a Ta or Ta alloy target surface measured with X-ray diffraction is 0.8 or less, and the ratio of the foregoing X-ray intensity at a depth of 100 μm or deeper is 0.4 or less. This Ta or Ta alloy target is capable of minimizing the fluctuation of the deposition speed for each target throughout the target life of a sputtering target, and thereby improving and stabilizing the production efficiency of semiconductors during the sputtering process, and contributing to the reduction of production costs.

15 Claims, 3 Drawing Sheets

U.S. PATENT DOCUMENTS

| | | | |
|---|---|---|---|
| 6,348,113 B1 | 2/2002 | Michaluk et al. | |
| 6,348,139 B1 | 2/2002 | Shah et al. | |
| 6,759,143 B2 | 7/2004 | Oda et al. | |
| 6,770,154 B2 | 8/2004 | Koenigsmann et al. | |
| 6,863,750 B2 * | 3/2005 | Michaluk et al. | 148/668 |
| 6,893,513 B2 | 5/2005 | Michaluk et al. | |
| 7,156,963 B2 | 1/2007 | Oda | |
| 2002/0063056 A1 | 5/2002 | Shah et al. | |
| 2003/0089429 A1 | 5/2003 | Koenigsmann et al. | |
| 2005/0268999 A1 | 12/2005 | Oda | |
| 2007/0023281 A1 | 2/2007 | Oda | |
| 2007/0062806 A1 | 3/2007 | Oda | |
| 2007/0062807 A1 | 3/2007 | Oda | |
| 2007/0102288 A1 | 5/2007 | Oda et al. | |

OTHER PUBLICATIONS

English Abstract of JP 2000-323433 A, Nov. 24, 2000.
English Abstract of JP 2000-239835 A, Sep. 5, 2000.
English Abstract of JP 2002-363736 A, Dec. 18, 2002.
English Abstract of JP 09-104972 A, Apr. 22, 1997.
English Abstract of JP 2002-363662 A, Dec. 18, 2002.
English Abstract of JP 62-642232 A, Sep. 20, 1994.
English Abstract of JP 2000-323434 A, Nov. 24, 2000.
English Abstract of JP 2004-027358 A, Jan. 29, 2004.
English Abstract of JP 01-215426 A, Aug. 29, 1989.
English Abstract of JP 61-124566 A, Jun. 12, 1986.
Michaluk et al., "Tantalum 101: Economics and Technology of Ta Materials", Semiconductor International, pp. 271-278, Jul. 2000.

* cited by examiner

Examples

Comparative Examples

Examples

Comparative Examples

Examples

Comparative Examples

SPUTTERING TARGET

BACKGROUND OF THE INVENTION

The present invention relates to a sputtering target capable of performing deposition on a wafer or a substrate during sputtering at a stable deposition speed.

The speed of forming a thin film on a wafer or a substrate during sputtering is not constant, and changes with the advancement of the erosion of the target. Normally, this change is a functional change associated with the target life, and deposition of a fixed film thickness is performed throughout the target life by functionally changing the sputtering time of the deposition device according to the target life. Generally, the sputtering time change program that is once set is valid even when the target is replaced, and there is no need to make fine adjustments or the like for each target.

Nevertheless, with a Ta target, variation in the deposition speed for each target throughout the target life is significant and, therefore, it has become recently known that there are many cases where it is necessary to re-input the sputtering time program midway during the target life, or, in certain cases, to replace the target ahead of time before reaching the end of the target life.

Re-programming of the sputtering time midway during the target life will significantly inhibit the production efficiency, and replacing an expensive material such as a Ta target midway through the target life will considerably increase the manufacturing cost. Thus, this is becoming a major problem at semiconductor production sites.

There have been previous references to the influence of the Ta target material on performance during sputtering, and it has been suggested that various impurities, gas components, plane orientation, surface roughness and crystal grain size affect the uniformity and generation of particles (for instance, refer to Patent Document 1). In addition, it has also been suggested that the plane orientation and its variation, crystal grain size and impurities affect the uniformity of a tantalum nitride film (for instance, refer to Patent Document 2).

In particular, Patent Document 1 describes that the deposition speed can be improved by selectively increasing the plane orientation of {111}, {200}, {211} having high atom density on the sputtered surface, and the uniformity can be improved by suppressing the variation of the plane orientation. Nevertheless, the current status is that there is no particular knowledge regarding the influence on the fluctuation of the deposition speed throughout the target life.

[Patent Document 1] Japanese Patent Laid-Open Publication No. H11-80942
[Patent Document 2] Japanese Patent Laid-Open Publication No. 2002-363736

SUMMARY OF THE INVENTION

Thus, an object of the present invention is to provide a Ta or Ta alloy target capable of minimizing the fluctuation of the deposition for each target throughout the target life of a sputtering target, and thereby improving and stabilizing the production efficiency of semiconductors during the sputtering process, and contributing to the reduction of production costs.

In order to achieve the foregoing object, as a result of intense study on how various target materials influence the deposition speed, the present inventors discovered that the existence of the {110} plane of the crystal orientation significantly affects the fluctuation of the deposition speed.

Based on the foregoing discovery, the present invention provides:
1. A sputtering target in which the ratio of X-ray intensity of (110) measured with X-ray diffraction is 0.4 or less in a Ta or Ta alloy target;
2. A sputtering target in which the ratio of X-ray intensity of (110) measured with X-ray diffraction is 0.2 or less in a Ta or Ta alloy target;
3. A sputtering target in which the ratio of X-ray intensity of (110) measured with X-ray diffraction is 0.8 or less on a Ta or Ta alloy target surface, and the ratio of the foregoing X-ray intensity at a depth of 100 µm or deeper is 0.4 or less;
4. A sputtering target in which the ratio of X-ray intensity of (110) measured with X-ray diffraction is 0.8 or less on a Ta or Ta alloy target surface, and the ratio of the foregoing X-ray intensity at a depth of 50 µm or deeper is 0.4 or less; and
5. A sputtering target in which the ratio of X-ray intensity of (110) measured with X-ray diffraction is 0.8 or less on a Ta or Ta alloy target surface, and the ratio of the foregoing X-ray intensity at a depth of 25 µm or deeper is 0.4 or less.

As described above, the X-ray intensity ratio of the {110} plane as referred to herein is defined according to the following formula. In other words, the X-ray intensity ratio is obtained by dividing the X-ray intensity of (110) measured with X-ray diffraction by the sum of the respective X-ray intensities of (110), (200), (211), (310), (222), (321).

$$\text{Formula: } (110)/\{(110)+(200)+(211)+(310)+(222)+(321)\}$$

The present invention yields a superior effect of being able to minimize the fluctuation of the deposition speed for each target throughout the target life of a tantalum or tantalum alloy sputtering target, and thereby improve and stabilize the production efficiency of semiconductors during the sputtering process, and contribute to the significant reduction of production costs.

DETAILED DESCRIPTION OF THE INVENTION

Figure 1:
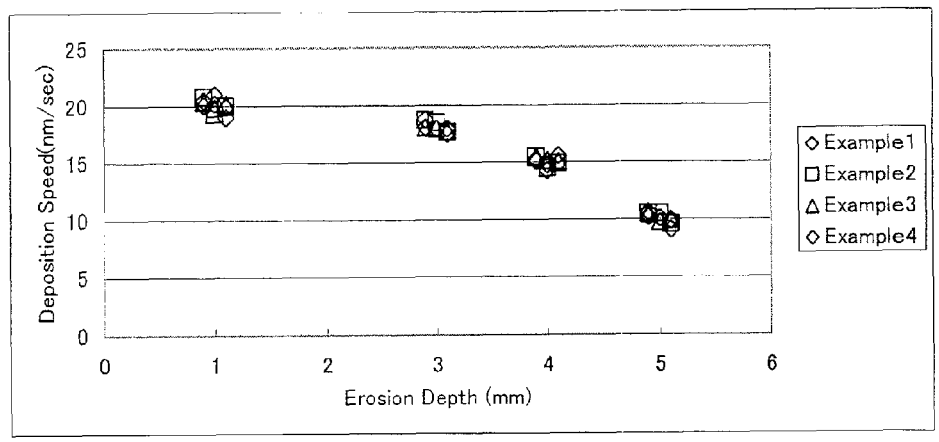
FIG. 1 is a diagram showing the relation (variation) of the deposition speed and erosion depth of the samples (n=3) of Examples 1 to 4.

As the influence that the target material has on the deposition speed, as described above, influence of the atom density can be considered. In other words, it should be possible to adjust the deposition speed by controlling the plane orientation of the sputtered surface.

That is to say, it is anticipated that the changes in the deposition speed can be minimized for each target throughout the target life by suppressing the variation of a specific plane or specific plane group in the thickness direction of the target, and maintaining this within a certain range.

Nevertheless, with a Ta target having a body-centered cubic structure, even if the plane orientation is minimized to an industrially possible range in the in-plane or depth direction, the current status is that it is not possible to suppress the variation in the deposition speed for each target.

Thus, as a result of using various magnets and examining the relation between the deposition speed and the magnet; that is, the relation of the shape change of the target surface arising from the erosion caused by sputtering and the deposition speed, it was discovered that fluctuation in the deposition speed for each target was greater when using a magnet in which the degree of irregularity of the target surface becomes intensified due to the erosion.

The actual sputtered surface changes from the initial flat surface into an erosion surface with irregularities as the sputtering process progresses. This is a macro change, and, conventionally, it has been recognized that the plane orientation of the target surface is simulated to be planar excluding the steeply-inclined irregular portions where the erosion is deep.

Nevertheless, with a material such as body-centered cubic metal that does not have much of an equivalent surface, even the inclination of a slight erosion surface will result in a considerable degree of fluctuation in the plane orientation. Thus, even if the variation of the plane orientation is controlled as much as possible, in reality, it is considered that this will cause a significant change in the deposition speed.

Thus, upon examining the relation between the XRD intensity of the {110} plane, which is considered to largely affect the deposition speed, and the fluctuation of the deposition speed, it was discovered that the fluctuation in the deposition speed for each target could be reduced by suppressing the XRD intensity of the {110} plane to be below a certain value.

This is considered to be because if the closed-packed plane exists on the erosion surface in excess of a certain degree, the fluctuation in the deposition when the erosion advances will increase due to the closed-packed plane.

Further, it was simultaneously discovered that the {110} plane is most easily formed on the outermost surface layer of the target. If there are many {110} planes near the surface, the deposition speed during the initial sputtering will become extremely fast, and it will become extremely difficult to functionally control the deposition speed throughout the target life. Thus, it was discovered that it is necessary to perform unwanted sputtering until the speed stabilized to a level where the sputtering speed could be functionally controlled.

Conventionally, it is well known that sputtering referred to as a burn-in is performed initially since the uniformity will become unstable during the initial stages of sputtering. Nevertheless, this phenomenon is not something that can be resolved with a brief burn-in, and requires time that is several times that of conventional burn-ins.

Although the XRD intensity of the {110} plane decreases pursuant to its retreat from the surface in this phenomenon, in certain cases, it was discovered that an area where the XRD intensity of the {110} plane that is higher than the bulk continued to a depth of 100 µm or deeper. Although the reason for this is unclear, as a result of intense study on controlling the {110} [plane] intensity of the surface, it was discovered that it is possible to reduce the intensity of the {110} plane of the surface by performing degassing heat treatment at a relatively low temperature in a vacuum.

Thereby, as a result of gas components and the like in the atmosphere being absorbed by the surface, this may be the reason why the {110} plane can more easily be formed on the target surface.

The reason why the ratio of X-ray intensity of (110) measured with X-ray diffraction is limited to be preferably 0.4 or less, and more preferably 0.2 or less is because, if the ratio exceeds 0.4, the functional control of the deposition speed will become virtually impossible, and, by making the ratio 0.2 or less, variation in the deposition speed for each target will become so small that it can be ignored.

With respect to the target surface, as described above, the X-ray diffraction intensity of the {110} plane will become higher than the bulk, and the reason why the intensity ratio is made to be 0.8 or less, and the intensity ratio at a depth of 100 µm or 50 µm or 25 µm from the surface or deeper is made to be 0.4 or less is because, if the intensity of the outermost surface exceeds 0.8, time that is several times that of an ordinary burn-in will be required until the deposition speed becomes stable, and the reason why the intensity ratio at a certain depth or deeper is made to be 0.4 or less is because, as described above, the functional control of the deposition speed will become virtually impossible if the ratio exceeds 0.4.

Further, although it is preferable that the area exceeding 0.4 is shallow in order to stabilize the deposition speed, it is necessary to increase the degassing heat treatment temperature in a vacuum in order to make such area shallow.

Nevertheless, since this heat treatment is to be performed to the shape of the final product, treatment at high temperatures may deform the target due to thermal distortion. Accordingly, the depth to become 0.4 or less was made to be 100 µm, 50 µm, and 25 µm based on the size tolerance of the product.

Although the present invention prescribes that the ratio of X-ray diffraction intensity of the {110} plane is 0.4 or less, and preferably 0.2 or less in a Ta or Ta alloy target, in this case, even if the X-ray intensity ratio of the {110} plane in the vicinity of the outermost surface exceeds 0.4 or 0.2, if the range thereof is minor at a level of several hundred µm or less from the surface; although the burn-in time will become longer and thereby increase the cost, it is clear that this will also be covered by the present invention from the purport hereof which enables the functional control of the deposition speed regardless of the type of target.

EXAMPLES

Examples and Comparative Examples of the present invention are now explained. Incidentally, these examples are merely illustrative, and the present invention shall in no way be limited thereby. In other words, the present invention shall include the various modes and modifications covered by the technical spirit of this invention.

Examples 1 to 4

An EB molten Ta ingot (φ 190×60 mmh) having a purity level of 4N5 was subject to deformation processing and heat treatment and used as the raw material in Examples 1 to 4. Foremost, the ingot was subject to cold tightening and forging up to φ 100×100 mmh, and thereafter subject to upset forging up to φ 60 mm.

After performing heat treatment for 2 hours at 1200° C., cold rolling was performed up to a thickness of 10 mm. The plane orientation was controlled by adjusting the degree of rolling process according to the thickness of the preform during upset forging. The degree of rolling process was as shown in Table 1. After cold rolling, the ingot was subject to heat treatment for 2 hours at 1000° C., and then subject to machining process to be formed into a target shape.

The target obtained with the foregoing process was sputtered, and the deposition speed and the erosion depth of the target were measured at a suitable timing of the target life. Since the erosion depth will change depending on the location of the target, the measurement location was made to be the location where the erosion was deepest. Moreover, the sputtered target was sampled, and the X-ray intensity of a surface parallel to the initial flat surface of the target was measured. The targets were made to be, under the same conditions, n=3 (3 samples).

Table 1 and FIG. 1 summarize the data of Examples 1 to 4. FIG. 1 shows the changes in the deposition speed for each target throughout the target life. Needless to say, this data is the original deposition speed data which was not subject to functional program control on the device side.

As shown in Table 1, the X-ray intensity ratio of the {110} plane of the target bulk was in the range of 0.03 to 0.38, which is within the range of the present invention. The tendency was such that higher the degree of rolling process (%), lower the intensity ratio of the {110} plane. Variation of the deposition speed was in the range of 0.4 to 1.5 nm/sec, and it is evident that higher the degree of rolling process (%), smaller the variation.

In particular, with Example 3 and Example 4, the X-ray intensity ratios of the {110} plane of the target bulk were in the range of 0.05 to 0.12 and 0.03 to 0.09, and were even lower in comparison to Example 1 and Example 2. The variations of the deposition speed in the foregoing case were 0.7 nm/sec and 0.4 nm/sec, and showed more favorable values. In other words, if the X-ray intensity ratio of the {110} plane based on the X-ray diffraction of the target bulk is small at 0.2 or less, it is evident that more superior characteristics can be realized.

Variation in the deposition speed shown in Examples 1 to 4 shows the largest degree of variation in the deposition speed throughout the target life in roughly the same erosion depth in the respective targets of n=3 (samples).

FIG. 1 is an illustration of the above, and shows that the variation in the deposition speed was small. Further, as shown in Table 1, the functional control of the deposition speed was possible in all cases.

Comparative Examples 1 to 3

As with Examples 1 to 4 described above, an EB molten Ta ingot (φ 190×60 mmh) having a purity level of 4N5 was subject to deformation processing and heat treatment and used as the raw material. Foremost, the ingot was subject to cold tightening and forging up to φ 100×100 mmh, and thereafter subject to upset forging up to φ 160 mm.

After performing heat treatment for 2 hours at 1200° C., cold rolling was performed up to a thickness of 10 mm. The plane orientation was controlled by adjusting the degree of rolling process according to the thickness of the preform during upset forging. The degree of rolling process was as shown in Table 2. After cold rolling, the ingot was subject to heat treatment for 2 hours at 1000° C., and then subject to machining process to be formed into a target shape.

The target obtained with the foregoing process was sputtered, and the deposition speed and the erosion depth of the target were measured at a suitable timing of the target life. Since the erosion depth will change depending on the location of the target, the measurement location was made to be the location where the erosion was deepest. Moreover, the sputtered target was sampled, and the X-ray intensity of a surface parallel to the initial flat surface of the target was measured. The targets were made to be, under the same conditions, n=3 (3 samples).

Figure 2:
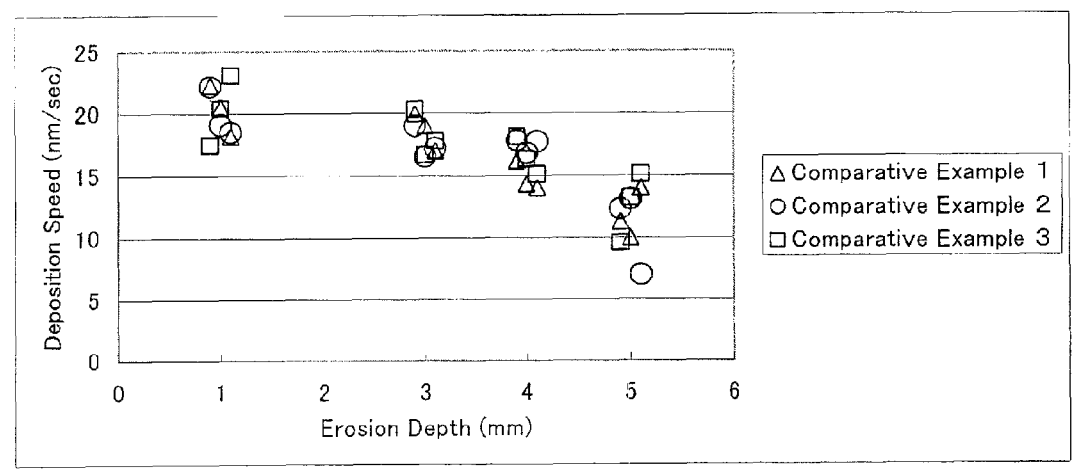
FIG. 2 is a diagram showing the relation (variation) of the deposition speed and erosion depth of the samples (n=3) of Comparative Examples 1 to 3.

Table 2 and FIG. 2 summarize the data of Comparative Examples 1 to 3. FIG. 2 shows the changes in the deposition speed for each target throughout the target life. Needless to say, this data is the original deposition speed data which was not subject to functional program control on the device side.

As shown in Table 2, the X-ray intensity ratio of the {110} plane in relation to the sum of the X-ray intensity of the respective planes of (110), (200), (211), (310), (222), (321) measured with X-ray diffraction of the target bulk was in the range of 0.45 to 0.60. The tendency was such that lower the degree of rolling process (%), higher the intensity ratio of the {110} plane, and all cases exceeded the conditions of the present invention. Variation of the deposition speed was in the range 4.1 to 5.6 nm/sec, and it is evident that lower the degree of rolling process (%), greater the variation, and these Comparative Examples could not achieve the objective of the present invention.

TABLE 1

| | Composition | Degree of Rolling Process (%) | {110} Intensity Ratio Bulk | {110} Intensity Ratio Surface | {110} Intensity Ratio at Depth of Approx. 100 μm | {110} Intensity Ratio at Depth of Approx. 50 μm | {110} Intensity Ratio at Depth of Approx. 25 μm | Vacuum Degassing Heat Treatment Temperature and Warping (mm) | Deposition Speed Variation (nm/sec) Note 1) | Functional Control of Deposition Speed |
|---|---|---|---|---|---|---|---|---|---|---|
| Example 1 | Ta | 80 | 0.20 to 0.35 | — | — | — | — | — | 1.5 | Yes |
| Example 2 | Ta | 75 | 0.15 to 0.38 | — | — | — | — | — | 1.5 | Yes |
| Example 3 | Ta | 89 | 0.05 to 0.12 | — | — | — | — | — | 0.7 | Yes |
| Example 4 | Ta | 92 | 0.03 to 0.09 | — | — | — | — | — | 0.4 | Yes |

Note 1):
Shows the peak throughout target life among variations in deposition speed in roughly the same erosion depth of the respective targets of n = 3 in the Examples.

Incidentally, variation in the deposition speed shown in Comparative Examples 1 to 3 shows the largest degree of variation in the deposition speed throughout the target life in roughly the same erosion depth in the respective targets of n=3 (samples).

FIG. 2 is an illustration of the above, and shows that the variation in the deposition speed is great. Further, as shown in Table 2, the functional control of the deposition speed was not possible in any of the cases.

surface parallel to the initial flat surface of the target was measured. The targets were made to be, under the same conditions, n=3 (3 samples).

Figure 3:
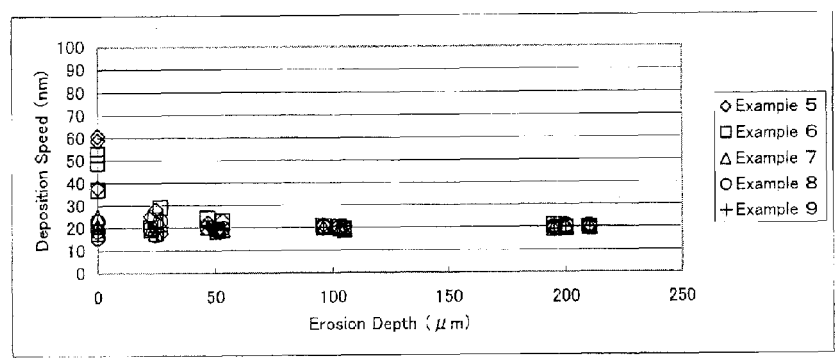
FIG. 3 is a diagram showing the relation (variation) of the deposition speed and erosion depth of the samples (n=3) of Examples 5 to 9.

Table 3 and FIG. 3 summarize the data of Examples 5 to 9. FIG. 3 shows the changes in the deposition speed for each target throughout the target life. Needless to say, this data is the original deposition speed data which was not subject to functional program control on the device side. FIG. 3 shows

TABLE 2

|  | Composition | Degree of Rolling Process (%) | {110} Intensity Ratio Bulk | {110} Intensity Ratio Surface | {110} Intensity Ratio at Depth of Approx. 100 μm | {110} Intensity Ratio at Depth of Approx. 50 μm | {110} Intensity Ratio at Depth of Approx. 25 μm | Vacuum Degassing Heat Treatment Temperature and Warping (mm) | Deposition Speed Variation (nm/sec) Note 1) | Functional Control of Deposition Speed |
|---|---|---|---|---|---|---|---|---|---|---|
| Comparative Example 1 | Ta | 40 | 0.45 to 0.58 | — | — | — | — | — | 4.1 | No |
| Comparative Example 2 | Ta | 35 | 0.50 to 0.59 | — | — | — | — | — | 4.7 | No |
| Comparative Example 3 | Ta | 20 | 0.55 to 0.60 | — | — | — | — | — | 5.6 | No |

Note 1):
Shows the peak throughout target life among variations in deposition speed in roughly the same erosion depth of the respective targets of n = 3 in the Comparative Examples.

Examples 5 to 9

An EB molten Ta ingot (φ 190×60 mmh) having a purity level of 4N5 was subject to deformation processing and heat treatment and used as the raw material. Foremost, the ingot was subject to cold tightening and forging up to φ 100×100 mmh, and thereafter subject to upset forging up to φ 160 mm.

After performing heat treatment for 2 hours at 1200° C., cold rolling was performed up to a thickness of 10 mm. The plane orientation was controlled by adjusting the degree of rolling process according to the thickness of the preform during upset forging. The degree of rolling process was as shown in Table 3.

After cold rolling, the ingot was subject to heat treatment for 2 hours at 1000° C., and then subject to machining process to be formed into a target shape. Certain targets were placed in a vacuum heat treatment furnace and subject to degassing heat treatment for 1 hour at 100° C., 150° C., and 200° C., and the warping of the target was thereby measured.

Further, the target obtained with the foregoing process was sputtered, and the deposition speed and the erosion depth of the target were measured at a suitable timing of the target life. Since the erosion depth will change depending on the location of the target, the measurement location was made to be the location where the erosion was shallowest. Moreover, the sputtered target was sampled, and the X-ray intensity of a the relation between the erosion depth and deposition speed of the target during the initial stages of sputtering.

As shown in Table 3, the X-ray intensity ratio of the {110} plane was in the range of 0.07 to 0.38. The tendency was such that higher the degree of rolling process (%), lower the intensity ratio of the {110} plane. Variation of the deposition speed was in the range of 4 to 23 nm/sec, and it is evident that higher the degree of rolling process (%), smaller the variation.

The foregoing case shows the largest degree only regarding the truly initial variation in the deposition speed of the target life. Thus, variation in the deposition speed of the initial stages of sputtering was great. This due to fact that the X-ray intensity ratio of the {110} plane of the surface is high at 0.52 to 0.78. Nevertheless, as a result of the erosion depth advancing to 25 μm, 50 μm, and 100 μm, variation in the deposition speed will decrease according to the reduction in the X-ray intensity ratio of the {110} plane. Variation in the deposition speed at the initial stages where the burn-in time is short can be ignored, and if the (110) [plane] intensity ratio will quickly become smaller thereafter, variation of the deposition speed will not particularly become a problem.

FIG. 3 shows the largest degree of variation in the deposition speed throughout the target life in roughly the same erosion depth in the respective targets of n=3 (samples). FIG. 3 shows that the variation in the deposition speed at roughly 100 μm or deeper was small. Further, as shown in Table 3, the functional control of the deposition speed was possible in all cases.

TABLE 3

|  | Composition | Degree of Rolling Process (%) | {110} Intensity Ratio Bulk | {110} Intensity Ratio Surface | {110} Intensity Ratio at Depth of Approx. 100 μm | {110} Intensity Ratio at Depth of Approx. 50 μm | {110} Intensity Ratio at Depth of Approx. 25 μm | Vacuum Degassing Heat Treatment Temperature and Warping (mm) | Deposition Speed Variation (nm/sec) Note 1) | Functional Control of Deposition Speed |
|---|---|---|---|---|---|---|---|---|---|---|
| Example 5 | Ta | 75 | 0.10 to 0.33 | 0.60 to 0.78 | 0.31 to 0.38 | 0.40 to 0.49 | 0.52 to 0.60 | 100 C. ° 0.04 to 0.05 | 23 | Yes |
| Example 6 | Ta | 90 | 0.05 to 0.10 | 0.58 to 0.75 | 0.28 to 0.35 | 0.44 to 0.58 | 0.47 to 0.69 | 100 C. ° 0.03 to 0.07 | 16 | Yes |

TABLE 3-continued

|  | Composition | Degree of Rolling Process (%) | {110} Intensity Ratio Bulk | {110} Intensity Ratio Surface | {110} Intensity Ratio at Depth of Approx. 100 μm | {110} Intensity Ratio at Depth of Approx. 50 μm | {110} Intensity Ratio at Depth of Approx. 25 μm | Vacuum Degassing Heat Treatment Temperature and Warping (mm) | Deposition Speed Variation (nm/sec) Note 1) | Functional Control of Deposition Speed |
|---|---|---|---|---|---|---|---|---|---|---|
| Example 7 | Ta | 65 | 0.25 to 0.38 | 0.54 to 0.61 | 0.18 to 0.25 | 0.25 to 0.36 | 0.33 to 0.45 | 150 C. ° 0.10 to 0.13 | 7 | Yes |
| Example 8 | Ta | 70 | 0.15 to 0.31 | 0.49 to 0.54 | 0.23 to 0.32 | 0.30 to 0.38 | 0.40 to 0.45 | 150 C. ° 0.11 to 0.15 | 4 | Yes |
| Example 9 | Ta | 85 | 0.07 to 0.19 | 0.43 to 0.52 | 0.03 to 0.07 | 0.05 to 0.11 | 0.09 to 0.15 | 200 C. ° 0.18 to 0.22 | 4 | Yes |

Note 1):
Shows the peak throughout target life among variations in deposition speed in roughly the same erosion depth of the respective targets of n = 3 in the Examples.

Comparative Examples 4 and 5

An EB molten Ta ingot (ϕ 190×60 mmh) having a purity level of 4N5 was subject to deformation processing and heat treatment and used as the raw material. Foremost, the ingot was subject to cold tightening and forging up to ϕ 100×100 mmh, and thereafter subject to upset forging up to ϕ 160 mm.

After performing heat treatment for 2 hours at 1200° C., cold rolling was performed up to a thickness of 10 mm. The plane orientation was controlled by adjusting the degree of rolling process according to the thickness of the preform during upset forging. The degree of rolling process was as shown in Table 4.

After cold rolling, the ingot was subject to heat treatment for 2 hours at 1000° C., and then subject to machining process to be formed into a target shape. Certain targets were placed in a vacuum heat treatment furnace and subject to degassing heat treatment for 1 hour at 100° C., 150° C., and 200° C.

Further, the target obtained with the foregoing process was sputtered, and the deposition speed and the erosion depth of the target were measured at a suitable timing of the target life. Since the erosion depth will change depending on the location of the target, the measurement location was made to be the location where the erosion was shallowest. Moreover, the sputtered target was sampled, and the X-ray intensity of a surface parallel to the initial flat surface of the target was measured. The targets were made to be, under the same conditions, n=3 (3 samples).

Figure 4:
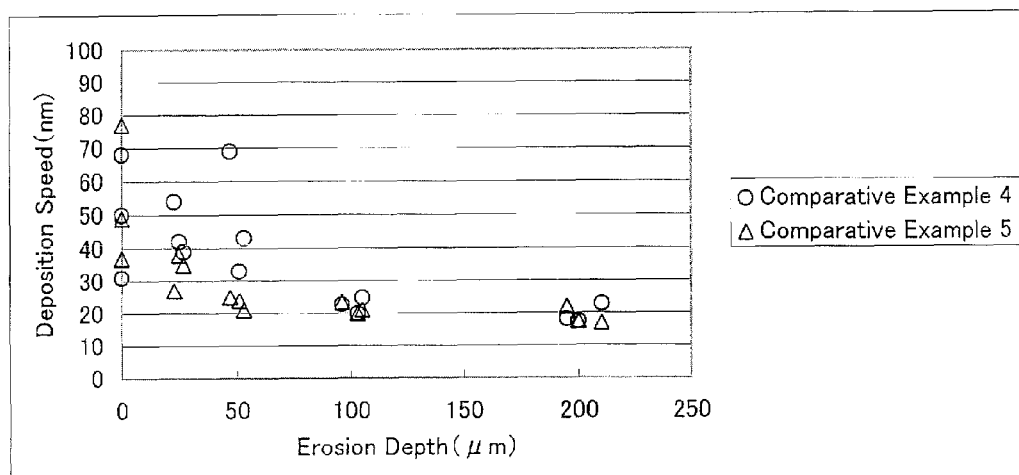
FIG. 4 is a diagram showing the relation (variation) of the deposition speed and erosion depth of the samples (n=3) of Comparative Examples 4 and 5.

Table 4 and FIG. 4 summarize the data of Comparative Examples 4 and 5. FIG. 4 shows the changes in the deposition speed for each target throughout the target life. Needless to say, this data is the original deposition speed data which was not subject to functional program control on the device side.

FIG. 4 shows the relation between the erosion depth and deposition speed of the target during the initial stages of sputtering.

As shown in Table 4, the X-ray intensity ratio of the {110} plane of the target bulk was in the range of 0.45 to 0.59. The tendency was such that higher the degree of rolling process (%), lower the intensity ratio of the {110} plane. Variation of the deposition speed was in the range of 37 to 40 nm/sec, and it is evident that higher the degree of rolling process (%), smaller the variation.

As with Examples 5 to 9, the foregoing case also shows the largest degree only regarding the truly initial variation in the deposition speed of the target life. Thus, variation in the deposition speed of the initial stages of sputtering was great. Nevertheless, even when the erosion depth advanced to 25 μm, 50 μm, and 100 μm, the X-ray intensity ratio of the {110} plane did not decrease, and it never fell below 0.4. Therefore, variation in the deposition speed continued to be great.

The results are shown in FIG. 4. FIG. 4 shows the largest degree of variation in the deposition speed throughout the target life in roughly the same erosion depth in the respective targets of n=3 (samples). FIG. 4 shows that the variation in the deposition speed at roughly 100 μm or deeper was small. Further, as shown in Table 4, the functional control of the deposition speed was not possible in any of the cases.

TABLE 4

|  | Composition | Degree of Rolling Process (%) | {110} Intensity Ratio Bulk | {110} Intensity Ratio Surface | {110} Intensity Ratio at Depth of Approx. 100 μm | {110} Intensity Ratio at Depth of Approx. 50 μm | {110} Intensity Ratio at Depth of Approx. 25 μm | Vacuum Degassing Heat Treatment Temperature and Warping (mm) | Deposition Speed Variation (nm/sec) Note 1) | Functional Control of Deposition Speed |
|---|---|---|---|---|---|---|---|---|---|---|
| Comparative Example 4 | Ta | 40 | 0.45 to 0.51 | 0.85 to 0.90 | 0.45 to 0.56 | 0.62 to 0.73 | 0.77 to 0.87 | — | 37 | No |
| Comparative Example 5 | Ta | 35 | 0.50 to 0.59 | 0.83 to 0.88 | 0.48 to 0.56 | 0.62 to 0.71 | 0.77 to 0.86 | — | 40 | No |

Note 1):
Shows the peak throughout target life among variations in deposition speed in roughly the same erosion depth of the respective targets of n = 3 in the Comparative Examples.

Examples 10 and 11

A Ta-5 wt % Mo EB molten ingot (ϕ 190×150 mmh) having a purity level of 4N5 was subject to deformation processing and heat treatment and used as the raw material. Foremost, the ingot was subject to cold tightening and forging up to ϕ 100×100 mmh, and thereafter subject to upset forging up to ϕ 160 mm.

After performing heat treatment for 2 hours at 1200° C., cold rolling was performed up to a thickness of 10 mm. The plane orientation was controlled by adjusting the degree of rolling process according to the thickness of the preform during upset forging. The degree of rolling process was as shown in Table 5.

After cold rolling, the ingot was subject to heat treatment for 2 hours at 1000° C., and then subject to machining process to be formed into a target shape.

Further, the target obtained with the foregoing process was sputtered, and the deposition speed and the erosion depth of the target were measured at a suitable timing of the target life. Since the erosion depth will change depending on the location of the target, the measurement location was made to be the location where the erosion was deepest. Moreover, the sputtered target was sampled, and the X-ray intensity of a surface parallel to the initial flat surface of the target was measured. The targets were made to be, under the same conditions, n=3 (3 samples).

Figure 5:
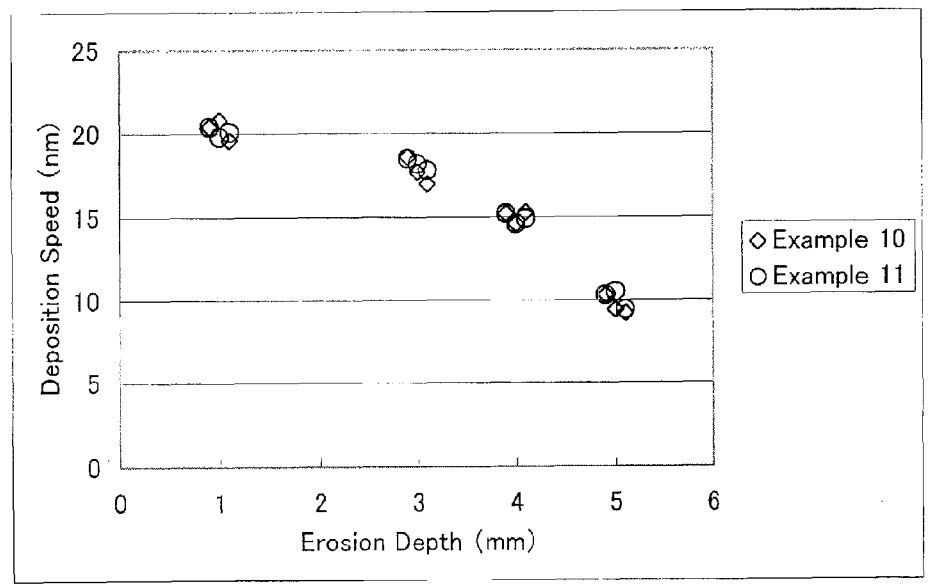
FIG. 5 is a diagram showing the relation (variation) of the deposition speed and erosion depth of the samples (n=3) of Examples 10 and 11.

Table 5 and FIG. 5 summarize the data of Examples 10 and 11. FIG. 5 shows the changes in the deposition speed for each target throughout the target life. Needless to say, this data is the original deposition speed data which was not subject to functional program control on the device side.

As shown in Table 5, the X-ray intensity ratio of the {110} plane of the target bulk was in the range of 0.05 to 0.37. The tendency was such that higher the degree of rolling process (%), lower the intensity ratio of the {110} plane. Variation of the deposition speed was in the range of 1.1 to 1.6 nm/sec, and it is evident that higher the degree of rolling process (%), smaller the variation.

In particularly, with Example 11, the X-ray intensity ratio of the {110} plane was 0.2 or less, and this case showed characteristic values that were even more favorable than Example 10.

These Examples show the same tendency as Example 3 and Example 4. In other words, by making the X-ray diffraction intensity ratio of the {110} plane to be 0.2 or less, it was possible to effectively inhibit variation in the deposition speed even further.

FIG. 5 shows the largest degree of variation in the deposition speed throughout the target life in roughly the same erosion depth in the respective targets of n=3 (samples). FIG. 5 shows that the variation in the deposition speed is small. Further, as shown in Table 5, the functional control of the deposition speed was possible in all cases.

Comparative Examples 6 and 7

A Ta-5 wt % Mo EB molten ingot (φ 190×60 mmh) having a purity level of 4N5 was subject to deformation processing and heat treatment and used as the raw material. Foremost, the ingot was subject to cold tightening and forging up to φ 100×100 mmh, and thereafter subject to upset forging up to φ 160 mm.

After performing heat treatment for 2 hours at 1200° C., cold rolling was performed up to a thickness of 10 mm. The plane orientation was controlled by adjusting the degree of rolling process according to the thickness of the preform during upset forging. The degree of rolling process was as shown in Table 6.

After cold rolling, the ingot was subject to heat treatment for 2 hours at 1000° C., and then subject to machining process to be formed into a target shape.

Further, the target obtained with the foregoing process was sputtered, and the deposition speed and the erosion depth of the target were measured at a suitable timing of the target life. Since the erosion depth will change depending on the location of the target, the measurement location was made to be the location where the erosion was deepest. Moreover, the sputtered target was sampled, and the X-ray intensity of a surface parallel to the initial flat surface of the target was measured. The targets were made to be, under the same conditions, n=3 (3 samples).

Figure 6:
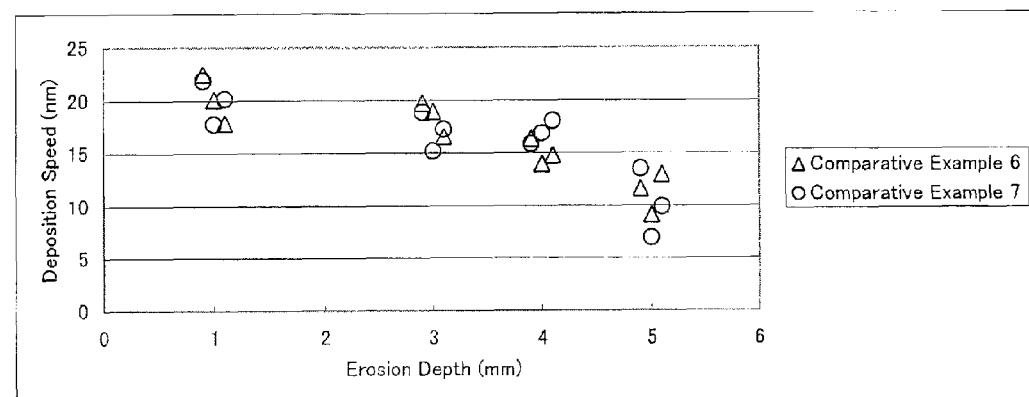
FIG. 6 is a diagram showing the relation (variation) of the deposition speed and erosion depth of the samples (n=3) of Comparative Examples 6 and 7.

Table 6 and FIG. 6 summarize the data of Comparative Examples 6 and 7. FIG. 6 shows the changes in the deposition speed for each target throughout the target life. Needless to say, this data is the original deposition speed data which was not subject to functional program control on the device side.

As shown in Table 6, the X-ray intensity ratio of the {110} plane of the target bulk was in the range of 0.43 to 0.66, and all cases exceeded the conditions of the present invention. Variation of the deposition speed was in the range of 4.6 to 6.6 nm/sec, and it is evident that higher the degree of roiling process (%), greater the variation, and these Comparative Examples could not achieve the objective of the present invention.

Incidentally, variation in the deposition speed shown in Comparative Examples 6 and 7 shows the largest degree of variation in the deposition speed throughout the target life in roughly the same erosion depth in the respective targets of n=3 (samples).

FIG. 6 is an illustration of the above, and shows that the variation in the deposition speed is great. Further, as shown in Table 6, the functional control of the deposition speed was not possible in any of the cases.

TABLE 5

| | Composition | Degree of Rolling Process (%) | {110} Intensity Ratio Bulk | {110} Intensity Ratio Surface | {110} Intensity Ratio at Depth of Approx. 100μ | {110} Intensity Ratio at Depth of Approx. 50μ | {110} Intensity Ratio at Depth of Approx. 25μ | Vacuum Degassing Heat Treatment Temperature and Warping (mm) | Deposition Speed Variation (nm/sec) Note 1) | Functional Control of Deposition Speed |
|---|---|---|---|---|---|---|---|---|---|---|
| Example 10 | Ta—Mo | 65 | 0.29 to 0.37 | — | — | — | — | — | 1.6 | Yes |
| Example 11 | Ta—Mo | 85 | 0.05 to 0.20 | — | — | — | — | — | 1.1 | Yes |

Note 1):
Shows the peak throughout target life among variations in deposition speed in roughly the same erosion depth of the respective targets of n = 3 in the Examples.

TABLE 6

| | Composition | Degree of Rolling Process (%) | {110} Intensity Ratio Bulk | {110} Intensity Ratio Surface | {110} Intensity Ratio at Depth of Approx. 100μ | {110} Intensity Ratio at Depth of Approx. 50μ | {110} Intensity Ratio at Depth of Approx. 25μ | Vacuum Degassing Heat Treatment Temperature and Warping (mm) | Deposition Speed Variation (nm/sec) Note 1) | Functional Control of Deposition Speed |
|---|---|---|---|---|---|---|---|---|---|---|
| Comparative Example 6 | Ta—Mo | 30 | 0.43 to 0.61 | — | — | — | — | — | 4.6 | No |
| Comparative Example 7 | Ta—Mo | 40 | 0.45 to 0.66 | — | — | — | — | — | 6.6 | No |

Note 1):
Shows the peak throughout target life among variations in deposition speed in roughly the same erosion depth of the respective targets of n = 3 in the Comparative Examples.

As shown in the foregoing Examples and Comparative Examples, the cases which were within the range of the present invention showed small variation in the deposition speed, and the functional control of the deposition speed was possible in all cases. In comparison, the Comparative Examples outside the conditions of the present invention showed great variation in the deposition speed, and the functional control of the deposition speed was not possible in any of the cases. Incidentally, as evident from the foregoing Examples, even in cases where the X-ray intensity ratio of the {110} plane only regarding the sputtered surface exceeds 0.4, so as long as such cases are able to achieve the X-ray intensity ratio of the {110} plane of 0.4 in the erosion surface at a depth of roughly 100 μm or deeper, this is a problem that can be resolved with burn-in, and it is evident that this in itself will not impair the target functions.

Although the Examples of the present invention only show the X-ray intensity ratio of the {110} plane as the bulk material regarding the tantalum alloy (Ta—Mo alloy), the results were the same as Examples 5 to 9. Further, based on the results of the foregoing tantalum and tantalum alloy (Ta—Mo alloy), it is evident that the other tantalum alloys having tantalum as its primary component such as alloy systems of compositions in which the crystal structure of Ta—W, Ta—Nb, Ta—Hf, Ta—Ti or the like is not significantly different from pure Ta will also achieve the same results as the Examples and Comparative Examples, and these are also covered by the present invention as a matter of course.

The present invention yields a superior effect of being able to minimize the fluctuation of the deposition speed for each target throughout the target life, and thereby improve and stabilize the production efficiency of semiconductors during the sputtering process, and contribute to the significant reduction of production costs. Thus, the present invention is extremely useful as a tantalum or tantalum alloy target.

The invention claimed is:

1. A sputtering target in which the ratio of X-ray intensity of (110) measured with X-ray diffraction in relation to the sum of the respective X-ray intensities of (110), (200), (211), (310), (222), (321) is 0.2 or less in a Ta or Ta alloy target having a microstructure obtained by melting and casting a raw material and subjecting the result to deformation processing and heat treatment.

2. A sputtering target in which the ratio of X-ray intensity of (110) measured with X-ray diffraction in relation to the sum of the respective X-ray intensities of (110), (200), (211), (310), (222), (321) is 0.8 or less on a target surface of a Ta or Ta alloy having a microstructure obtained by melting and casting a raw material and subjecting the result to deformation processing and heat treatment, and the ratio of said X-ray intensity at a depth of 100 μm or deeper is 0.4 or less.

3. A sputtering target in which the ratio of X-ray intensity of (110) measured with X-ray diffraction in relation to the sum of the respective X-ray intensities of (110), (200), (211), (310), (222), (321) is 0.8 or less on a target surface of a Ta or Ta alloy having a microstructure obtained by melting and casting a raw material and subjecting the result to deformation processing and heat treatment, and the ratio of said X-ray intensity at a depth of 50 μm or deeper is 0.4 or less.

4. A sputtering target in which the ratio of X-ray intensity of (110) measured with X-ray diffraction in relation to the sum of the respective X-ray intensities of (110), (200), (211), (310), (222), (321) is 0.8 or less on a Ta or Ta alloy having a microstructure obtained by melting and casting a raw material and subjecting the result to deformation processing and heat treatment, and the ratio of said X-ray intensity at a depth of 25 μm or deeper is 0.4 or less.

5. A sputtering target according to claim 4, wherein the ratio of said X-ray intensity at the depth of 25 μm or deeper is 0.2 or less.

6. A sputtering target according to claim 4, wherein the Ta or Ta alloy consists of Ta.

7. A sputtering target according to claim 4, wherein the Ta or Ta alloy is a Ta alloy selected from the group consisting of a Ta—Mo alloy, a Ta—W alloy, a Ta—Hf alloy, and a Ta—Ti alloy.

8. A sputtering target according to claim 3, wherein the ratio of said X-ray intensity at the depth of 50 μm or deeper is 0.2 or less.

9. A sputtering target according to claim 3, wherein the Ta or Ta alloy consists of Ta.

10. A sputtering target according to claim 3, wherein the Ta or Ta alloy is a Ta alloy selected from the group consisting of a Ta—Mo alloy, a Ta—W alloy, a Ta—Hf alloy, and a Ta—Ti alloy.

11. A sputtering target according to claim 2, wherein the ratio of said X-ray intensity at the depth of 100 μm or deeper is 0.2 or less.

12. A sputtering target according to claim 2, wherein the Ta or Ta alloy consists of Ta.

13. A sputtering target according to claim 2, wherein the Ta or Ta alloy is a Ta alloy selected from the group consisting of a Ta—Mo alloy, a Ta—W alloy, a Ta—Hf alloy, and a Ta—Ti alloy.

14. A sputtering target according to claim 1, wherein the Ta or Ta alloy target consists of a Ta target.

15. A sputtering target according to claim 1, wherein the Ta or Ta alloy target is a Ta alloy target selected from the group consisting of a Ta—Mo alloy, a Ta—W alloy, a Ta—Hf alloy, and a Ta—Ti alloy.

* * * * *

UNITED STATES PATENT AND TRADEMARK OFFICE
CERTIFICATE OF CORRECTION

| | |
|---|---|
| PATENT NO. | : 8,177,947 B2 |
| APPLICATION NO. | : 11/912450 |
| DATED | : May 15, 2012 |
| INVENTOR(S) | : H. Miyashita |

It is certified that error appears in the above-identified patent and that said Letters Patent is hereby corrected as shown below:

Column 1, line 44, "{111}" should read "{110}".

Column 10, line 62, "150 mmh" should read "60 mmh".

Signed and Sealed this
Thirty-first Day of July, 2012

David J. Kappos
*Director of the United States Patent and Trademark Office*